United States Patent
Guler et al.

(10) Patent No.: US 12,131,989 B2
(45) Date of Patent: Oct. 29, 2024

(54) VERTICAL METAL SPLITTING USING HELMETS AND WRAP-AROUND DIELECTRIC SPACERS

(71) Applicant: Intel Corporation, Santa Clara, CA (US)

(72) Inventors: Leonard P. Guler, Hillsboro, OR (US); Charles Henry Wallace, Portland, OR (US); Paul A. Nyhus, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 748 days.

(21) Appl. No.: 17/099,823

(22) Filed: Nov. 17, 2020

(65) Prior Publication Data

US 2022/0157708 A1    May 19, 2022

(51) Int. Cl.
*H01L 21/768*    (2006.01)
*G06F 1/16*    (2006.01)
(Continued)

(52) U.S. Cl.
CPC ............ *H01L 23/5222* (2013.01); *G06F 1/16* (2013.01); *H01L 21/76838* (2013.01);
(Continued)

(58) Field of Classification Search
CPC ......... H01L 21/76885; H01L 23/53295; H01L 21/76834; H01L 23/481; H01L 21/76877; H01L 21/76895; H01L 23/5226; H01L 23/5222; H01L 21/76838; H01L 23/142; H01L 23/50; H01L 23/528; H01L 21/76832; G06F 1/16
See application file for complete search history.

(56) References Cited

U.S. PATENT DOCUMENTS

| 5,895,977 A | 4/1999 | Banerjee |
| 10,014,256 B2 * | 7/2018 | Nelson ................ H01L 23/5283 |

(Continued)

FOREIGN PATENT DOCUMENTS

| WO | 2008036385 A1 | 3/2008 |
| WO | 2017171751 A1 | 10/2017 |
| WO | 2019066792 A1 | 4/2019 |

OTHER PUBLICATIONS

Extended European Search Report and Patentability in European Patent Application 21198250.9 dated May 11, 2022, 8 pages.

*Primary Examiner* — Galina G Yushina
(74) *Attorney, Agent, or Firm* — Akona IP PC

(57) ABSTRACT

Methods for fabricating an IC structure, e.g., for fabricating a metallization stack portion of an IC structure, as well as related semiconductor devices, are disclosed. An example fabrication method includes splitting metal lines that are supposed to be included at a tight pitch in a single metallization layer into two vertically-stacked layers (hence the term "vertical metal splitting") by using helmets and wrap-around dielectric spacers. Metal lines split into two such layers may be arranged at a looser pitch in each layer, compared to the pitch at which metal lines of the same size would have to be arranged if there were included in a single layer. Increasing the pitch of metal lines may advantageously allow decreasing the parasitic metal-to-metal capacitance associated with the metallization stack.

19 Claims, 11 Drawing Sheets

(51) Int. Cl.
*H01L 23/14* (2006.01)
*H01L 23/50* (2006.01)
*H01L 23/522* (2006.01)
*H01L 23/528* (2006.01)

(52) U.S. Cl.
CPC ............ *H01L 23/142* (2013.01); *H01L 23/50* (2013.01); *H01L 23/528* (2013.01)

(56) References Cited

U.S. PATENT DOCUMENTS

| | | |
|---|---|---|
| 10,332,899 B2 | 6/2019 | Xu et al. |
| 2008/0073748 A1* | 3/2008 | Bielefeld .......... H01L 23/53295 257/E23.152 |
| 2011/0272812 A1 | 11/2011 | Horak et al. |
| 2012/0032344 A1 | 2/2012 | Usami |
| 2012/0153490 A1 | 6/2012 | Vannier |
| 2016/0254267 A1* | 9/2016 | Tao ........................ H10B 10/18 438/637 |
| 2017/0004975 A1* | 1/2017 | Farmer ............... H01L 29/0649 |
| 2017/0200601 A1* | 7/2017 | Song .................... C11D 3/3707 |
| 2018/0005839 A1* | 1/2018 | Mont ............... H01L 21/76834 |
| 2018/0138085 A1* | 5/2018 | Wang ............... H01L 21/32135 |
| 2018/0174904 A1* | 6/2018 | Hsieh ............... H01L 21/76831 |
| 2019/0013175 A1* | 1/2019 | Tandon ............... H01J 37/3177 |
| 2019/0019748 A1* | 1/2019 | Wallace ............ H01L 21/76834 |

* cited by examiner

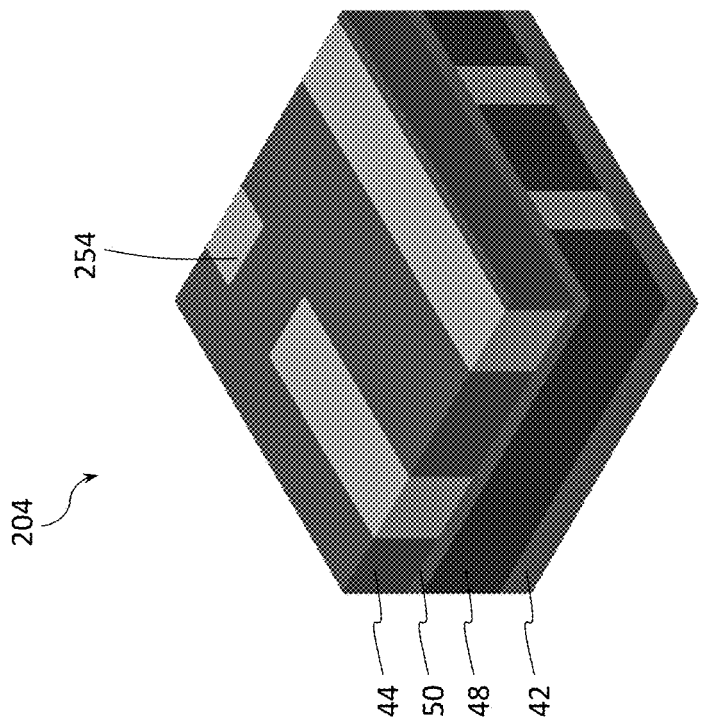
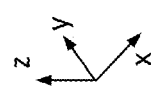
FIG. 2B
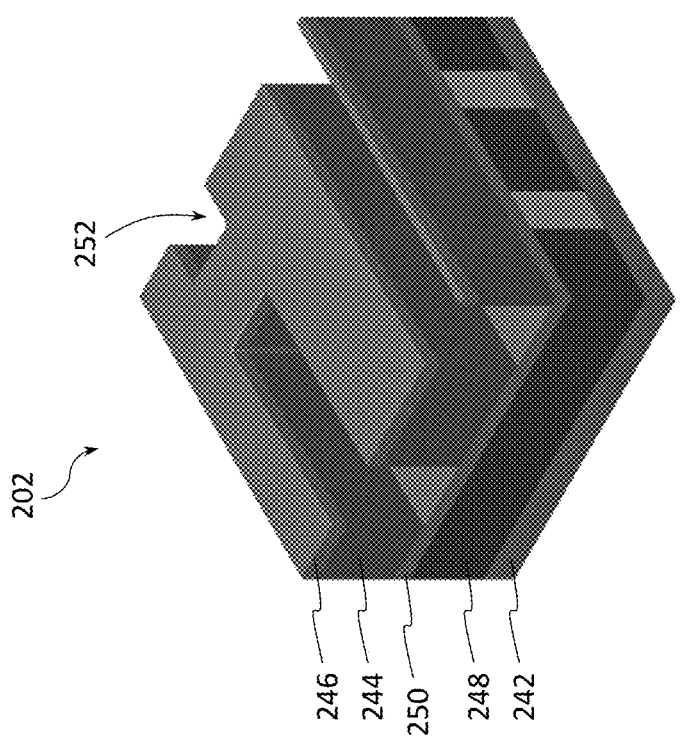
FIG. 2A

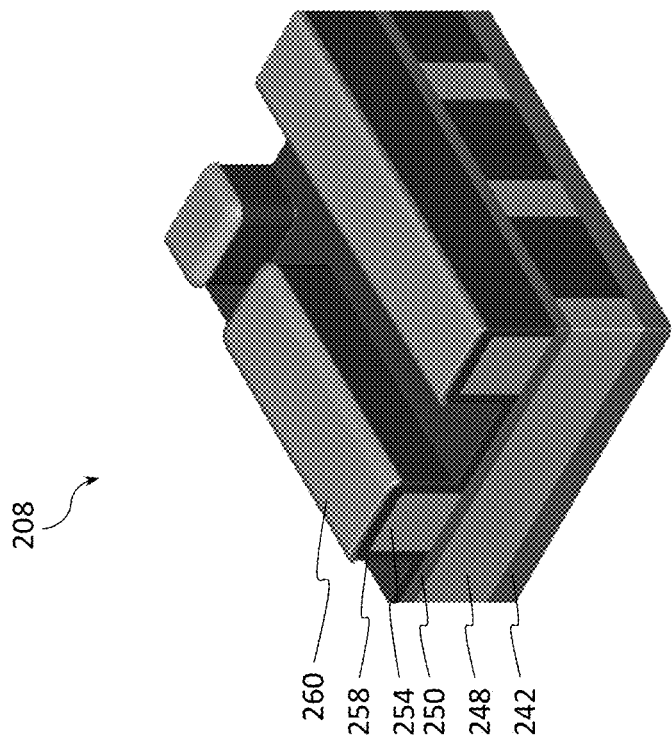
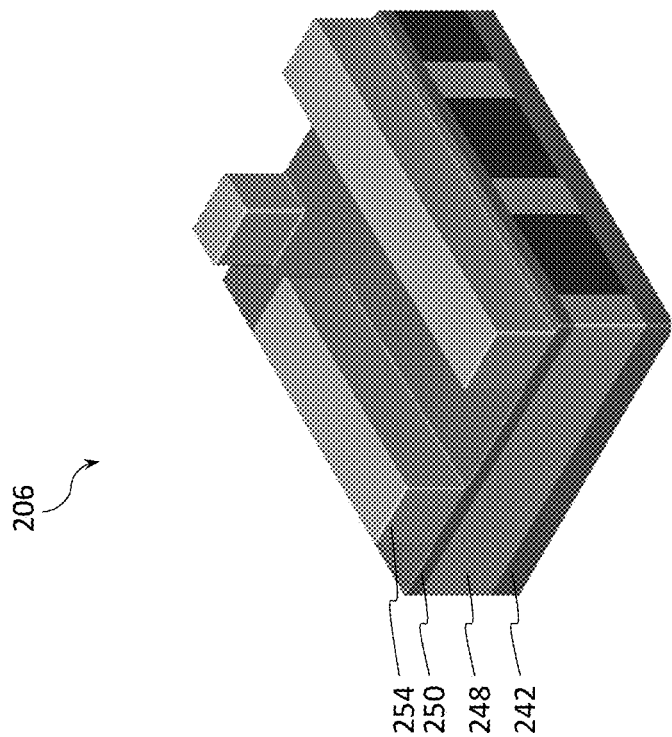
FIG. 2D
FIG. 2C

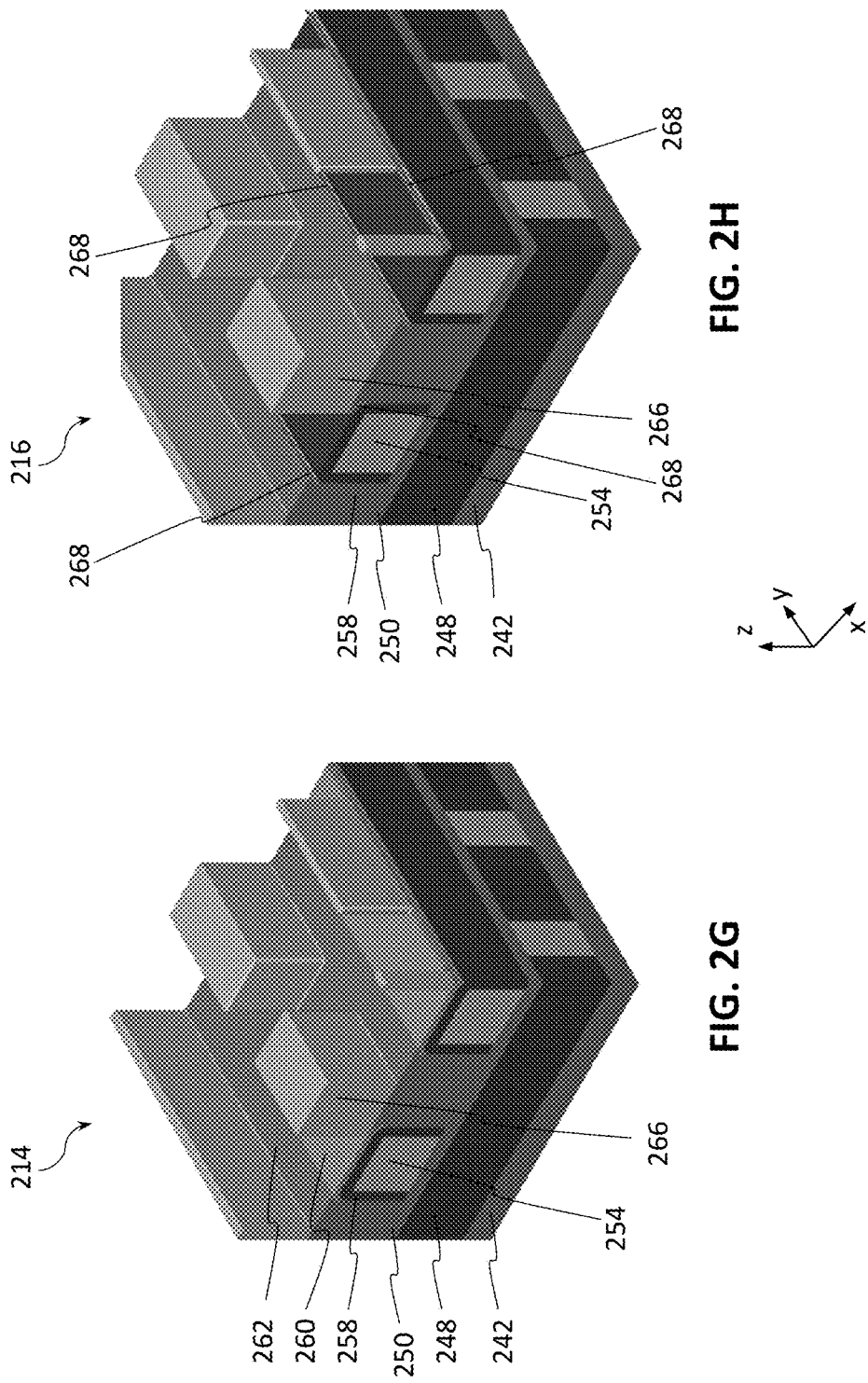

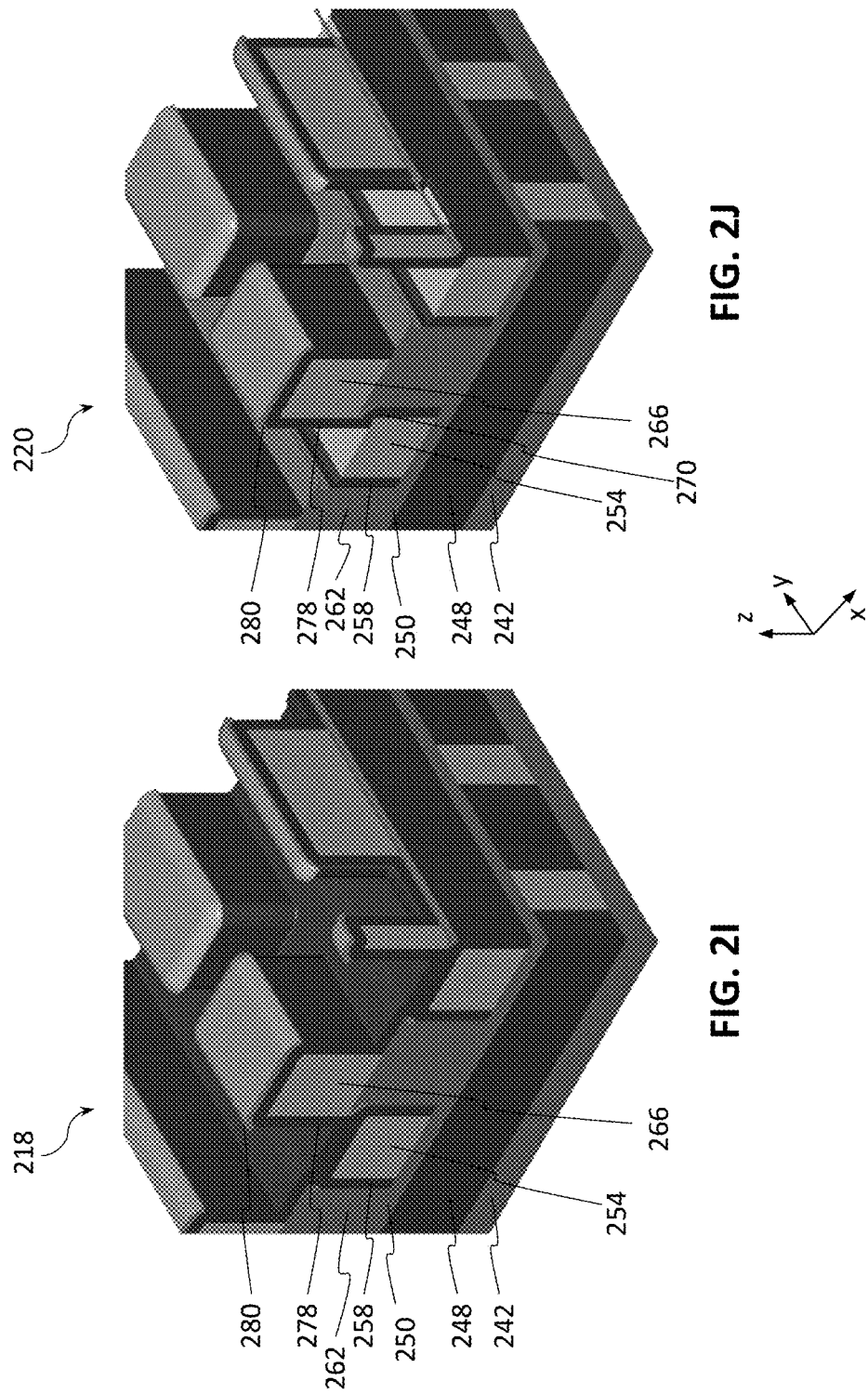

VERTICAL METAL SPLITTING USING HELMETS AND WRAP-AROUND DIELECTRIC SPACERS

TECHNICAL FIELD

This disclosure relates generally to the field of semiconductor devices, and more specifically, to metallization stacks of integrated circuit (IC) structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2K illustrate perspective views at various stages in the manufacture of an example IC structure according to the method of FIG. 1, in accordance with some embodiments.

DETAILED DESCRIPTION

Overview

Figure 1:
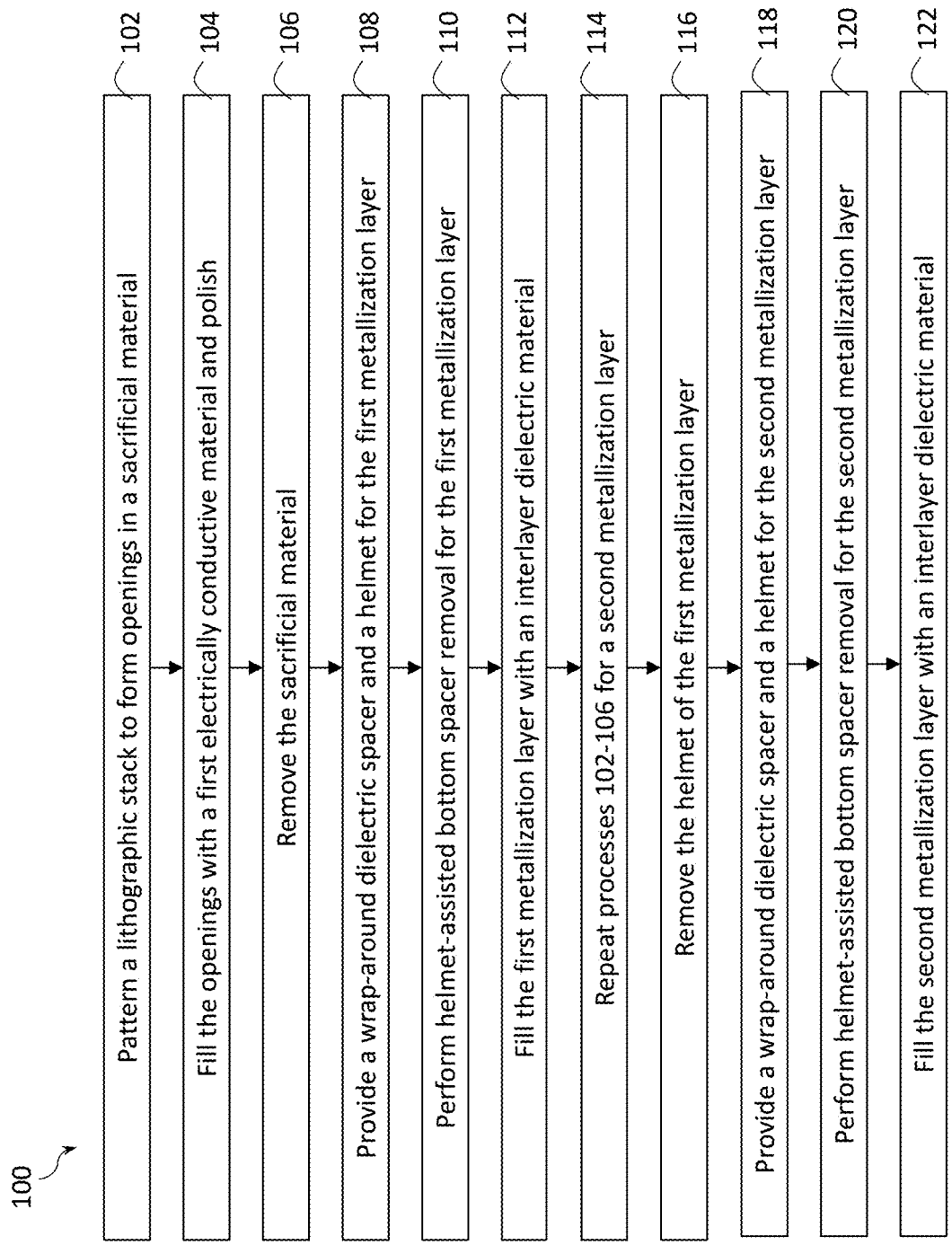
FIG. 1 provides a flow diagram of an example method for performing vertical metal splitting using helmets and wrap-around dielectric spacers to fabricate a metallization stack of an IC structure, in accordance with some embodiments.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating metallization stacks fabricated using helmets and wrap-around dielectric spacers to realize vertical metal splitting as described herein it might be useful to first understand phenomena that may come into play during IC fabrication. The following foundational information may be viewed as a basis from which the present disclosure may be properly explained. Such information is offered for purposes of explanation only and, accordingly, should not be construed in any way to limit the broad scope of the present disclosure and its potential applications.

IC structures commonly include electrically conductive microelectronic structures, known in the art as interconnects, to provide electrical connectivity to one or more components associated with an IC or/and between various such components. In this context, the term "metallization stack" may be used to describe a stacked series of layers of electrically conductive wires (sometimes referred to as "metal lines" or "metal tracks") which are electrically insulated from one another except for when/where they may need to be electrically connected. In a typical metallization stack, electrical connections between metal lines of different layers of a metallization stack are realized by means of vias filled with one or more electrically conductive materials, extending in a direction substantially perpendicular to the planes of the metal lines (i.e., extending in a vertical direction if the plane of the metal lines is considered to be a horizontal plane).

In the past, the sizes and the spacing of interconnects such as metal lines and vias have progressively decreased, and it is expected that in the future the sizes and the spacing of the interconnects will continue to progressively decrease, for at least some types of ICs (e.g., advanced microprocessors, chipset components, graphics chips, etc.). One measure of a size of a metal line is the critical dimension of the line width. One measure of a spacing between a pair of adjacent metal lines is the line pitch, representing a center-to-center distance between the closest adjacent metal lines of a given layer of a metallization stack.

Smaller and smaller sizes and spacing of interconnects demands that performance of every interconnect is optimized. Resistance (R) and capacitance (C) provide some measures of performance optimization parameters for metallization stacks. In general, it is desirable to decrease all resistances and capacitances associated with interconnects of a metallization stack. However, optimizing metallization stacks in terms of RC-characteristics while realizing the target size and pitches of metal lines is not an easy task. For example, one challenge with metal lines arranged in a tight pitch is that metals of the adjacent metal lines effectively form capacitors, thus increasing parasitic metal-to-metal capacitance associated with the metallization stack.

Disclosed herein are methods for fabricating an IC structure, e.g., for fabricating a metallization stack portion of an IC structure, as well as related semiconductor devices. An example fabrication method includes splitting metal lines that are supposed to be included at a tight pitch in a single metallization layer into two vertically-stacked layers (hence, such an approach is referred to herein as "vertical metal splitting") by using helmets and wrap-around dielectric spacers. Metal lines split into two such layers may be arranged at a looser (i.e., an increased) pitch in each layer, compared to the pitch at which metal lines of the same size would have to be arranged if there were included in a single layer. Increasing the pitch of metal lines may advantageously allow decreasing the parasitic metal-to-metal capacitance associated with the metallization stack.

As used herein, the term "bottom metal line" refers to any electrically conductive structure/line that is provided in a layer of a metallization stack that is closer to the support structure than another layer of the metallization stack, while the term "top metal line" refers to any electrically conductive structure/line that is provided in the layer of the metallization stack that is above the layer of the bottom metal lines. In other words, the bottom metal lines are provided in a layer of the metallization stack that is between the support structure and the layer in which the top metal lines are provided. In various embodiments, such bottom and top metal lines may include electrically conductive structures other than lines/trenches (e.g., at least a portion of the bottom metal line may be a gate contact), and/or may be formed, or include, electrically conductive materials other than metals.

IC structures as described herein, in particular metallization stacks fabricated using helmets and wrap-around dielectric spacers to realize vertical metal splitting as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 3A-3B, such a collection may be referred to herein without the letters, e.g., as "FIG. 3."

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

For example, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials.

In another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

In yet another example, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Fabricating a Metallization Stack Using Helmets and Wrap-Around Dielectric Spacers FIG. 1 provides a flow diagram of an example method 100 for performing vertical metal splitting using helmets and wrap-around dielectric spacers to fabricate a metallization stack of an IC structure, in accordance with some embodiments.

Although the operations of the method 100 are illustrated once each and in a particular order, the operations may be performed in any suitable order and repeated as desired. For example, one or more operations may be performed in parallel to manufacture, substantially simultaneously, multiple metallization stacks fabricated using helmets and wrap-around dielectric spacers to realize vertical metal splitting as described herein. In another example, the operations may be performed in a different order to reflect the structure of a particular device assembly in which one or more metallization stacks fabricated using helmets and wrap-around dielectric spacers to realize vertical metal splitting as described herein will be included.

In addition, the example manufacturing method 100 may include other operations not specifically shown in FIG. 1, such as various cleaning or planarization operations as known in the art. For example, in some embodiments, a support structure, as well as layers of various other materials subsequently deposited thereon, may be cleaned prior to, after, or during any of the processes of the method 100 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the arrangements/devices described herein may be planarized prior to, after, or during any of the processes of the method 100 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Various operations of the method 100 may be illustrated with reference to the example embodiments shown in FIGS. 2A-2K, illustrating perspective views at various stages in the manufacture of an example IC structure according to the method 100, in accordance with some embodiments. Although a certain number of a given element may be illustrated in FIGS. 2A-2K (e.g., three bottom metal lines and five top metal lines), this is simply for ease of illustration, and more, or less, than that number may be included in IC structures according to various embodiments of the present disclosure. Still further, various views shown in some of the drawings are intended to show relative arrangements of various elements therein. In other embodiments, various IC structures with metallization stacks fabricated using helmets and wrap-around dielectric spacers as described herein, or portions thereof, may include other elements or components that are not illustrated (e.g., transistor portions, various components that may be in electrical contact with any of the bottom metal lines and/or the top metal lines, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., physical failure analysis (PFA) would allow determination of presence of one or more metallization stacks fabricated using helmets and wrap-around dielectric spacers to realize vertical metal splitting as described herein.

Turning to FIG. 1, the method 100 may begin with a process 102 that includes providing, over a support structure, a sacrificial material and a mask, and patterning the mask to form openings in the sacrificial material. An IC structure 202, depicted in FIG. 2A, illustrates an example result of the process 102. As shown in FIG. 2A, the IC structure 202 may include a support structure 242, a layer of a sacrificial material 244 provided over the support structure 242, and a mask 246 provided over the sacrificial material 244. Thus, the sacrificial material 244 is between the support structure 242 and the mask 246. FIG. 2A further illustrates that the mask 246 has been patterned and the pattern has been transferred to the sacrificial material 244, thus forming openings 252 (a plurality of which is shown but only one of which is labeled with the reference numeral in FIG. 2A in order to not clutter the drawing).

FIG. 2A also illustrates that, in some embodiments, a layer 248 may be present between the support structure 242 and the sacrificial material 244. The layer 248 may include various devices (e.g., transistors provided over the support structure 242, including front-end and/or back-end transistors, one or more other layers of a metallization stack, etc.). Furthermore, FIG. 2A illustrates that, in some embodiments, a layer of an etch-stop material 250 may be present between the layer 248 and the sacrificial material 244. In various embodiments, the etch-stop material 250 may include materials such as aluminum nitride, aluminum oxide, silicon nitride, or silicon carbon nitride.

In general, implementations of the disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which an IC may be built falls within the spirit and scope of the present disclosure. In various embodiments, the support structure 242 may include any such substrate, possibly with some layers and/or devices already formed thereon, not specifically shown in the present figures but which could be present within the layer 248, providing a suitable surface for forming metallization stacks fabricated using helmets and wrap-around dielectric spacers to realize vertical metal splitting.

In some embodiments, the sacrificial material 244 may be a low-k or high-k dielectric including, but not limited to, dielectric materials that include elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the sacrificial material 244 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, the sacrificial material 244 may be a low-k dielectric material. Examples of the low-k dielectric materials that may be used as the sacrificial material 244 include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the sacrificial material 244 include organic polymers such as polyimide, benzocyclobutene, polynorbornenes, perfluorocyclobutane, or polytetrafluoroethylene (PTFE). Still other examples of low-k dielectric materials that may be used as the sacrificial material 244 include silicon-based polymeric dielectrics such as hydrogen silsesquioxane (HSQ) and methylsilsesquioxane (MSQ). Other examples of low-k materials that may be used in the sacrificial material 244 include various porous dielectric materials, such as for example porous silicon dioxide or porous carbon-doped silicon dioxide, where voids or pores are created in a dielectric in order to reduce the overall dielectric constant of the material, since voids or pores can have a dielectric constant of nearly 1.

In various embodiments, the sacrificial material 244 may be deposited over the support structure 242 in the process 102 using a deposition technique such as, but not limited to, spin-coating, dip-coating, atomic layer deposition (ALD), chemical vapor deposition (CVD), or physical vapor deposition (PVD) (e.g., evaporative deposition, magnetron sputtering, or e-beam deposition).

The mask 246 may include any suitable mask material (e.g., any conventional lithographic stack of materials, which may, e.g., include a carbon hard mask) in which openings may be formed, defining the approximate locations, geometry, and dimensions of the openings 252 in the sacrificial material 244. The mask 246 may be patterned in the process 102 using any suitable technique, such as photolithography or electron-beam lithography. The patterns formed in the mask 246 may then be transferred to the sacrificial material 244, e.g., by etching the sacrificial material 244 through the openings patterned in the mask 246, to form the openings 252 in the sacrificial material 244. In some embodiments, the process 102 may include performing an anisotropic etch to form the openings 252 in the sacrificial material 244. Such an anisotropic etch may include an etch that uses etchants in a form of e.g., chemically active ionized gas (i.e., plasma) using e.g., bromine (Br) and chloride (Cl) based chemistries. In some embodiments, during the etch of the process 102, the IC structure may be heated to elevated temperatures, e.g., to temperatures between about room temperature and 200 degrees Celsius, including all values and ranges therein, to promote that byproducts of the etch are made sufficiently volatile to be removed from the surface. In some embodiments, the anisotropic etch of the process 102 may include a dry etch, such as radio frequency (RF) reactive ion etch (RIE) or inductively coupled plasma (ICP) RIE.

The method 100 may then include a process 104 that involves filling the openings in the sacrificial material with a first electrically conductive material and polishing the IC structure to remove excess of the first electrically conductive material. An IC structure 204, depicted in FIG. 2B, illustrates an example result of the process 104. As shown in FIG. 2B, the IC structure 204 may include a first electrically conductive material 254 deposited in the openings 252. In some embodiments, the process 104 may include, first, depositing the first electrically conductive material 254 everywhere over the IC structure 202, including in the openings 252 and over the sacrificial material 244, and then performing a suitable polishing process, e.g., CMP, to remove excess of the first electrically conductive material 254, e.g., to expose the top surfaces of the sacrificial material 244. The mask 246 may be removed prior to filling the openings 252 with the first electrically conductive material 254, e.g., using a process known as ashing. By virtue of being deposited in the openings 252, the first electrically conductive material 254 will adapt the shapes of the openings 252 to provide bottom metal lines (formed of the first electrically conductive material 254) of the first metallization layer of the future metallization stack. Therefore, in the following the bottom metal lines may be referred to as the "bottom metal lines 254."

In various embodiments, the first electrically conductive material 254 may be deposited over the support structure 242 in the process 102 using a deposition technique such as, but not limited to, ALD, CVD, PVD, plasma enhanced CVD (PECVD), or electroplating. In general, various electrically conductive materials described herein, e.g., the first electrically conductive material 254, may include one or more of any suitable electrically conductive materials (conductors). Such materials may include any suitable electrically conductive material, alloy, or a stack of multiple electrically conductive materials. In some embodiments, various electrically conductive materials described herein may include one or more metals or metal alloys, with metals such as copper, ruthenium, palladium, platinum, cobalt, nickel, molybdenum, hafnium, zirconium, titanium, tantalum, and aluminum. In some embodiments, various electrically conductive materials described herein may include one or more electrically conductive alloys, oxides (e.g., conductive metal oxides), carbides (e.g., hafnium carbide, zirconium carbide, titanium carbide, tantalum carbide, and aluminum carbide, tungsten, tungsten carbide), or nitrides (e.g. hafnium nitride, zirconium nitride, titanium nitride, tantalum nitride, and aluminum nitride) of one or more metals.

The method 100 may then include a process 106 that involves removing the sacrificial material. An IC structure 206, depicted in FIG. 2C, illustrates an example result of the process 106. As shown in FIG. 2C, the IC structure 206 is substantially the same as the IC structure 204, except that the sacrificial material 244 has been removed. In general, the sacrificial material 244 may include a material that is sufficiently etch-selective with respect to the first electrically conductive material 254. As known in the art, two materials are said to have "sufficient etch selectivity" when etchants used to etch one material do not substantially etch the other, enabling selective etching of one material but not the other. This is satisfied if the sacrificial material 244 is a dielectric material because dielectric materials and metallic materials have large etch selectivity. However, in general, the sacrificial material 244 may include a material that is not dielectric as long as it is sufficiently etch-selective with respect to the first electrically conductive material 254. Thus, the process 106 may include performing any suitable etch, e.g., an anisotropic etch as described above or an isotropic etch (e.g., a wet etch using dilute HF acid etch) to remove the sacrificial material 244. The etch-stop material 250 may be used to prevent the etchants used in the process 106 from etching into the layers under the layer with the bottom metal lines 254 (i.e., under the first metallization layer of the future metallization stack).

Next, the method 100 may include a process 108 that involves depositing a wrap-around dielectric spacer and a helmet for the first metallization layer. An IC structure 208, depicted in FIG. 2D, illustrates an example result of the process 108. As shown in FIG. 2D, the IC structure 208 includes a wrap-around dielectric spacer 258, conformally deposited over all surfaces of and in between the bottom metal lines 254. The IC structure 208 further includes a helmet 260, provided over the top portions of the bottom metal lines 254 wrapped around by the wrap-around dielectric spacer 258.

In various embodiments, the wrap-around dielectric spacer 258 may be deposited using any suitable conformal deposition technique such as ALD or CVD. The wrap-around dielectric spacer 258 may include any of the dielectric materials described above as long as it is sufficiently etch-selective with respect to an interlayer dielectric material (ILD) which will later be deposited around the bottom metal lines 254. In some embodiments, the wrap-around dielectric spacer 258 may be a low-k dielectric. Providing a low-k dielectric material wrapping around the bottom metal lines 254 may help further decrease parasitic capacitance associated with the metallization stack. In some embodiments, the thickness of the wrap-around dielectric spacer 258 may be between about 2 and 20 nanometers, including all values and ranges therein, e.g., between about 2 and 15 nanometers, or between about 3 and 10 nanometers.

The helmet 260 may also be deposited using a conformal deposition technique such as ALD or CVD, as long as portions of the helmet 260 that may be deposited on the sidewalls and in between the bottom metal lines 254 may be removed to arrive at the helmet 260 being shaped substantially as shown in FIG. 2D. As shown in FIG. 2D, the shape of the helmet 260 should be such as to protect the wrap-around dielectric spacer 258 on the sidewalls of the bottom metal lines 254 from being removed in a subsequent etch process of the method 100. Thus, the helmet 260 may hang over, or wrap around, a portion of the top of the bottom metal lines 254 wrapped with the wrap-around dielectric spacer 258 to form a helmet over such wrapped bottom metal lines 254. In some embodiments, the helmet 260 may include any of the dielectric materials described above as long as it is sufficiently etch-selective with respect to the wrap-around dielectric spacer 258. In other embodiments, the helmet 260 may include a metallic material such as titanium nitride, titanium oxide, or aluminum oxide, ensuring sufficient etch selectivity with respect to the wrap-around dielectric spacer 258. In still other embodiments, the helmet 260 may include a semiconductor material, such as amorphous silicon. In some embodiments, the thickness of the helmet 260 may be between about 2 and 20 nanometers, including all values and ranges therein, e.g., between about 2 and 15 nanometers, or between about 3 and 10 nanometers.

Figures 2E, 2F:
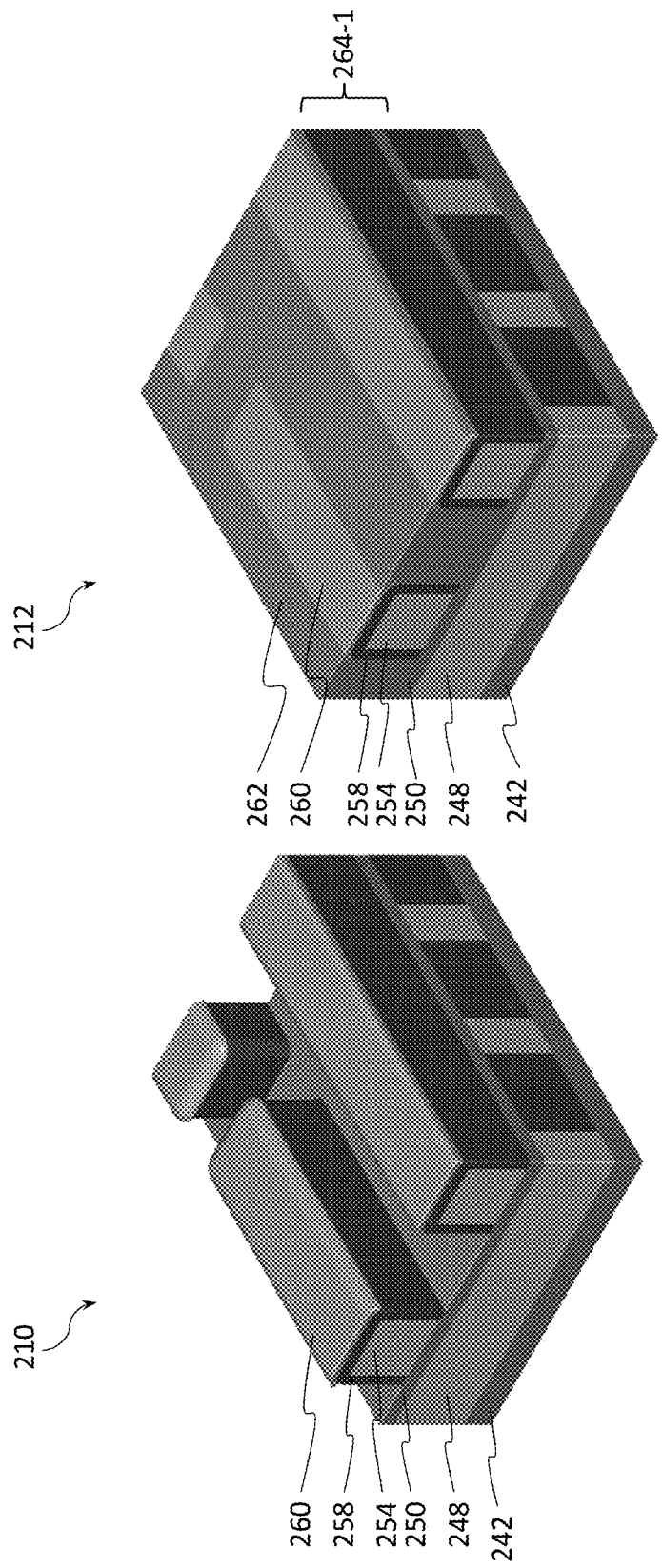

The method 100 may then proceed with a process 110 that involves removing the wrap-around dielectric spacer deposited in the process 108 in areas not protected by the helmet that was also deposited in the process 108. An IC structure 210, depicted in FIG. 2E, illustrates an example result of the process 110. As shown in FIG. 2E, the IC structure 210 is substantially the same as the IC structure 208 except that the wrap-around dielectric spacer 258 that is not covered by the helmet 260, i.e., the wrap-around dielectric spacer 258 that was present at the bottom of the openings of the IC structure 208 (i.e., in between the bottom metal lines 254), has been removed, exposing the underlying material (e.g., the etch-stop material 250, as is illustrated in the example shown). Therefore, this process may be referred to as a "helmet-assisted bottom spacer removal." The process 110 may include performing an anisotropic etch (e.g., any of the anisotropic etches described above), using etchants that can remove the wrap-around dielectric spacer 258 from the bottom of the first metallization layer, without substantially removing the wrap-around dielectric spacer 258 from the sidewalls and tops of the bottom metal lines 254 of the first metallization layer.

The method 100 may then include a process 112 that involves filling the openings between the bottom metal lines wrapped with the wrap-around dielectric and covered with the helmet with an ILD material. An IC structure 212, depicted in FIG. 2F, illustrates an example result of the process 112. As shown in FIG. 2F, the IC structure 212 may include an ILD material 262 provided in all openings of the IC structure 210, i.e., in between the bottom metal lines 254 wrapped with the wrap-around dielectric spacer 258 and covered with the helmet 260. In some embodiments, the process 112 may include, first, depositing the ILD material 262 everywhere over the IC structure 210, and then performing a suitable polishing process, e.g., CMP, to remove excess of the ILD material 262, e.g., to expose the top surfaces of the helmet 260. At this point, the first metallization layer may be said to be completed, the first metallization layer labeled in FIG. 2F as a layer 264-1. The ILD material 262 may include any suitable dielectric material, e.g., any of the dielectric materials described above, as long as it is sufficiently etch-selective with respect to the wrap-around dielectric spacer 258.

The method 100 may further proceed with a process 114 that involves repeating processes 102-106 to form metal lines of a second metallization layer. An IC structure 214, depicted in FIG. 2G, illustrates an example result of the process 114. As shown in FIG. 2G, the IC structure 214 includes top metal lines 266 formed of an electrically conductive material. The electrically conductive material of the top metal lines 266 may include any of the electrically conductive materials described above and may have the same or different material composition compared to the electrically conductive material of the bottom metal lines 254.

The method 100 may then proceed with a process 116 that involves removing the helmet of the first metallization layer that is exposed at the bottom of the second metallization layer having the top metal lines 266. An IC structure 216, depicted in FIG. 2H, illustrates an example result of the process 116. As shown in FIG. 2H, the IC structure 216 is substantially the same as the IC structure 214 except that most of the helmet 260 has been removed, exposing the wrap-around dielectric spacer 258 that was under the helmet 260. The process 116 may include performing any suitable etch (e.g., any of the etches described above), using etchants that can remove the exposed helmet 260 from the top of the first metallization layer, without substantially removing the wrap-around dielectric spacer 258 that was under the helmet 260. Because, as described above, the helmet 260 may be provided in the process so that portions of it hang over, or wrap around, a portion of the top of the bottom metal lines 254, those portions of the helmet 260 may be enclosed by the ILD material of the first metallization layer and, therefore, remain after the etch of the process 116. Such portions of the helmet 260 of the first metallization layer that may remain after the process 116 are shown in FIG. 2H as remaining helmet portions 268 and are indicative of the use of the method 100 when the final IC structure (e.g., the one shown in FIG. 2K) is analyzed.

Next, the method 100 may include a process 118 that involves depositing a wrap-around dielectric spacer and a helmet for the second metallization layer. An IC structure 218, depicted in FIG. 2I, illustrates an example result of the process 118. As shown in FIG. 2I, the IC structure 218 includes a wrap-around dielectric spacer 278, conformally deposited over all surfaces of and in between the top metal lines 266. The IC structure 218 further includes a helmet 280, provided over the top portions of the top metal lines 266 wrapped around by the wrap-around dielectric spacer 278. Descriptions of the wrap-around dielectric spacer 258 and the helmet 260 provided above with reference to the first metallization layer are applicable to the wrap-around dielectric spacer 278 and the helmet 280 of the second metallization layer. In various embodiments, the wrap-around dielectric spacer 258 and the wrap-around dielectric spacer 278 may have either the same or different material compositions. Similarly, in various embodiments, the helmet 260 and the helmet 280 may have either the same or different material compositions, as long as the helmet 280 is sufficiently etch-selective with respect to both the wrap-around dielectric spacer 258 and the wrap-around dielectric spacer 278. Descriptions provided with respect to the process 108 are applicable to the process 118 except that now the process is applied to the top metal lines 266 of the second metallization layer and, therefore, in the interests of brevity, are not repeated here.

The method 100 may then proceed with a process 120 that involves removing the wrap-around dielectric spacer of the second metallization layer, deposited in the process 118, not protected by the helmet that was also deposited in the process 118. Process 120 may also include removing the wrap-around dielectric spacer of the first metallization layer that was under the wrap-around dielectric spacer of the second metallization layer in areas where the helmet of the first metallization layer was removed. An IC structure 220, depicted in FIG. 2J, illustrates an example result of the process 120. As shown in FIG. 2J, the IC structure 220 is substantially the same as the IC structure 218 except that the wrap-around dielectric spacer 278 that is not covered by the helmet 280, i.e., the wrap-around dielectric spacer 278 that was present at the bottom of the openings of the IC structure 218 (i.e., in between the top metal lines 266), has been removed. As further shown in FIG. 2J, the wrap-around dielectric spacer 258 that was exposed at the bottom of the second metallization layer in the IC structure 216 (i.e., the wrap-around dielectric spacer 258 that was exposed by the removal of the helmet 260 in the process 116 and ended up being right under the wrap-around dielectric spacer 278 after the process 118) is also removed, exposing the underlying electrically conductive material of the bottom metal lines 254. Similar to the process 110, the process 120 is also a helmet-assisted bottom spacer removal. The process 120 may include performing an anisotropic etch (e.g., any of the anisotropic etches described above), using etchants that can remove the wrap-around dielectric spacer 278 from the bottom of the second metallization layer, without substantially removing the wrap-around dielectric spacer 278 from the sidewalls and tops of the top metal lines 266 of the second metallization layer, as well as remove the wrap-around dielectric spacer 258 that is exposed by said removal of the wrap-around dielectric spacer 278. In this manner, the top of the bottom metal lines 254 may be exposed but the bottom metal lines 254 and the top metal lines 266 remain electrically isolated by the presence of the wrap-around dielectric spacer 258 of the first metallization layer that was not exposed by the etch of the process 120 (e.g., in an area 270, shown in FIG. 2J).

Figure 2K:
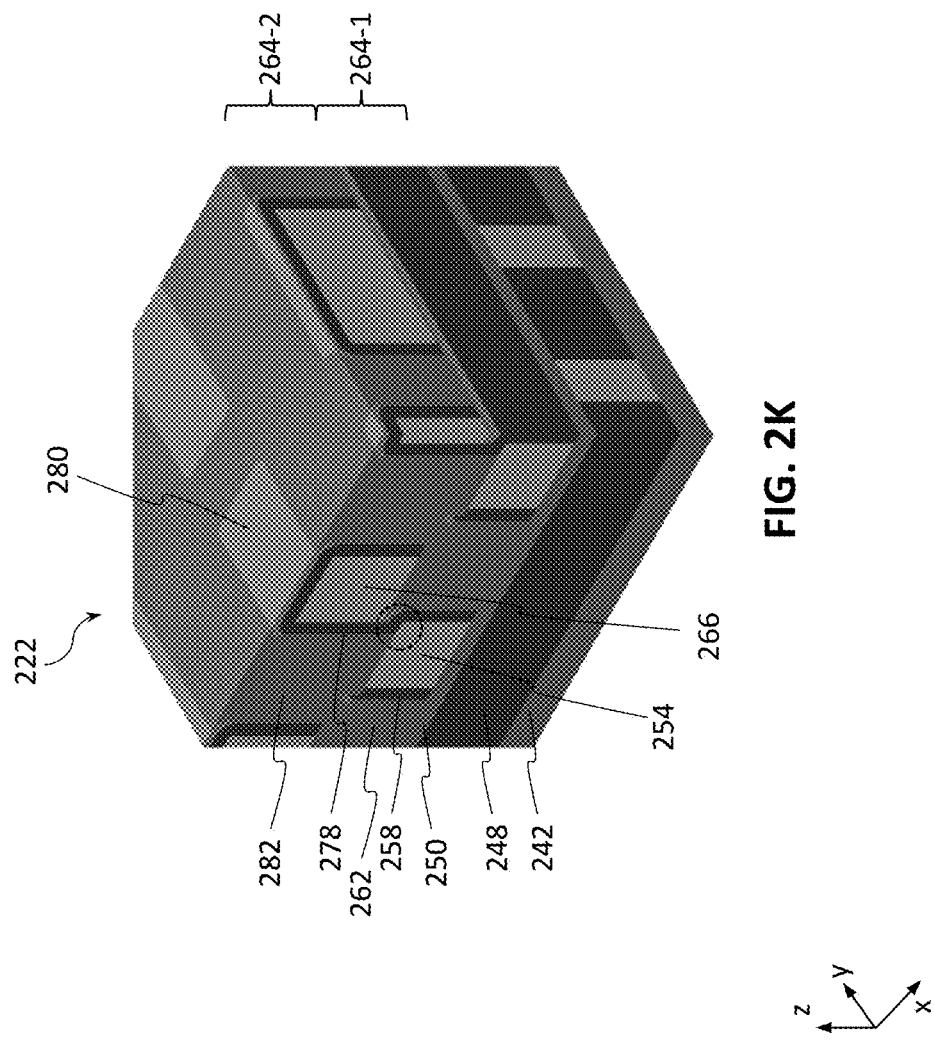

The method 100 may then include a process 122 that involves filling the openings between the top metal lines wrapped with the wrap-around dielectric and covered with the helmet with an ILD material. An IC structure 222, depicted in FIG. 2K, illustrates an example result of the process 122. As shown in FIG. 2K, the IC structure 222 may include an ILD material 282 provided in all openings of the IC structure 220, i.e., in between the top metal lines 266 wrapped with the wrap-around dielectric spacer 278 and covered with the helmet 280. In some embodiments, the process 122 may include, first, depositing the ILD material 282 everywhere over the IC structure 220, and then performing a suitable polishing process, e.g., CMP, to remove excess of the ILD material 282, e.g., to expose the top surfaces of the helmet 280. At this point, the second metallization layer may be said to be completed, the second metallization layer labeled in FIG. 2K as a layer 264-2. The ILD material 282 may include any suitable dielectric material, e.g., any of the dielectric materials described above, as long as it is sufficiently etch-selective with respect to the wrap-around dielectric spacer 278.

The method 100 may then proceed with repeating processes 114-122 to provide further metallization layers stacked above the second metallization layer 264-2.

The use of at least some processes of the fabrication method 100 leaves several characteristic features in the final IC structures that are indicative of the method 100 being used, some of which features will now be described.

One characteristic feature indicative of the use of the method 100 is that the bottom and top metal lines 254, 266 are such that their projections on the support structure 242 are substantially parallel to one another, and the sidewalls of the bottom and top metal lines 254, 266 are lined with the wrap-around dielectric spacers 258, 278, respectively. In some embodiments, the wrap-around dielectric spacer 278 on one of the sidewalls of one of the top metal lines 266 may be in contact with the wrap-around dielectric spacer 258 on one of the sidewalls of one of the bottom metal lines 254, e.g., within a region circled in a dashed circle shown in a cross-sectional view of FIG. 2K (said region extending along the lines in the direction of the y-axis of the example coordinate system shown in FIG. 2K). The bottom and top metal lines 254, 266 may be staggered with respect to one another.

Another characteristic feature indicative of the use of the method 100 is that each of the wrap-around dielectric spacer 278 and wrap-around dielectric spacer 258 is sufficiently etch-selective with respect to the ILD material 262. On the other hand, the wrap-around dielectric spacer 278 and wrap-around dielectric spacer 258 may be not etch-selective with respect to one another.

Yet another characteristic feature indicative of the use of the method 100 is that, in some implementations, some of the helmet 260 may remain in the final IC structure, e.g., the remaining helmet portions 268, described above with reference to FIG. 2H. Such remaining helmet portions 268 may extend along one or both upper edges of at least some (or all) of the bottom metal lines 254. An "edge" is where two faces of a metal line meet, and "upper edges" refer to where faces of different sidewalls of a metal line meet the top face of the metal line. The helmet 260 is sufficiently etch-selective with respect to the wrap-around dielectric spacer 258 and the ILD material 262, as described above with reference to the processes 110 and 116, respectively. In some embodiments, the helmet 280 may also remain over at least portions of the top metal lines 266, the helmet 280 being sufficiently etch-selective with respect to the wrap-around dielectric spacer 278.

Example Devices

The IC structures with metallization stacks fabricated using helmets and wrap-around dielectric spacers to realize vertical metal splitting, disclosed herein, may be included in any suitable electronic device. FIGS. 3-6 illustrate various examples of apparatuses that may include one or more of the IC structures disclosed herein.

Figures 3A, 3B:
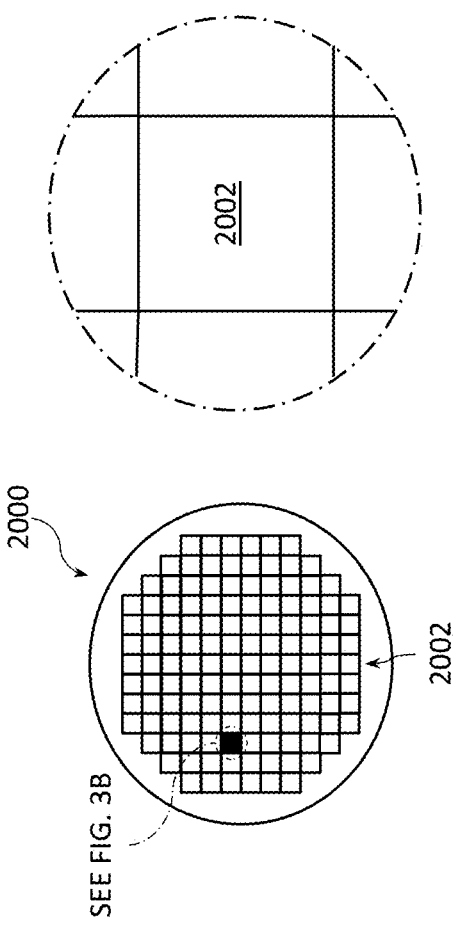
FIGS. 3A and 3B are top views of, respectively, a wafer and dies that may include one or more metallization stacks fabricated using helmets and wrap-around dielectric spacers to realize vertical metal splitting, in accordance with various embodiments.

FIGS. 3A-3B are top views of a wafer 2000 and dies 2002 that may include one or more metallization stacks fabricated using helmets and wrap-around dielectric spacers to realize vertical metal splitting in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 4. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more metallization stacks fabricated using helmets and wrap-around dielectric spacers to realize vertical metal splitting as described herein). After the fabrication of the semiconductor product is complete (e.g., after manufacture of two or more layers of the metallization stacks fabricated using helmets and wrap-around dielectric spacers to realize vertical metal splitting as described herein), the wafer 2000 may undergo a singulation process in which each of the dies 2002 is separated from one another to provide discrete "chips" of the semiconductor product. In particular, devices that include one or more metallization stacks fabricated using helmets and wrap-around dielectric spacers to realize vertical metal splitting as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a static random access memory (SRAM) device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 6) or other logic that is configured to store information in the memory devices or execute instructions stored in the memory array.

Figure 4:
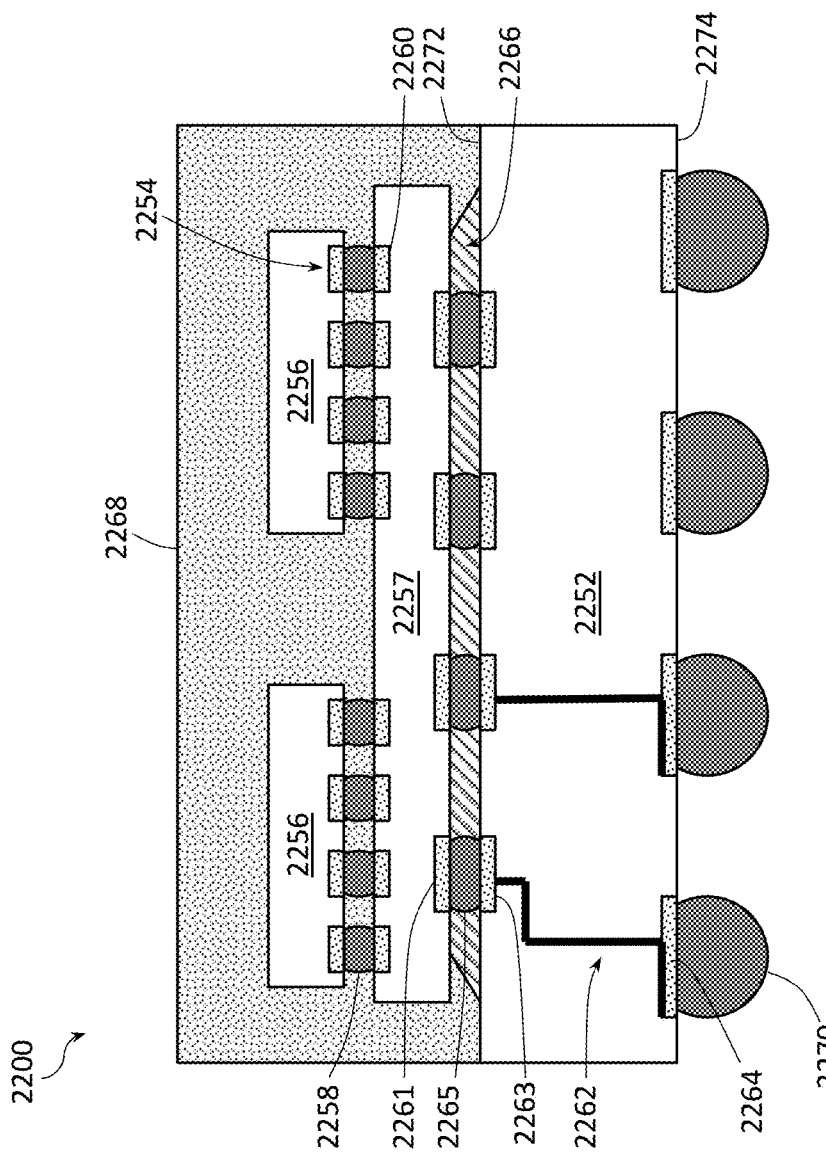
FIG. 4 is a cross-sectional side view of an IC package that may include one or more metallization stacks fabricated using helmets and wrap-around dielectric spacers to realize vertical metal splitting, in accordance with various embodiments.

FIG. 4 is a side, cross-sectional view of an example IC package 2200 that may include one or more metallization stacks fabricated using helmets and wrap-around dielectric spacers to realize vertical metal splitting in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 4 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 4 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 4 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 5.

The dies 2256 may take the form of any of the embodiments of the die 2002 discussed herein (e.g., may include any of the embodiments of the metallization stacks fabricated using helmets and wrap-around dielectric spacers to realize vertical metal splitting as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory). In some embodiments, any of the dies 2256 may include one or more metallization stacks fabricated using helmets and wrap-around dielectric spacers to realize vertical metal splitting as discussed above; in some embodiments, at least some of the dies 2256 may not include any metallization stacks fabricated using helmets and wrap-around dielectric spacers to realize vertical metal splitting.

The IC package 2200 illustrated in FIG. 4 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 4, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 5:
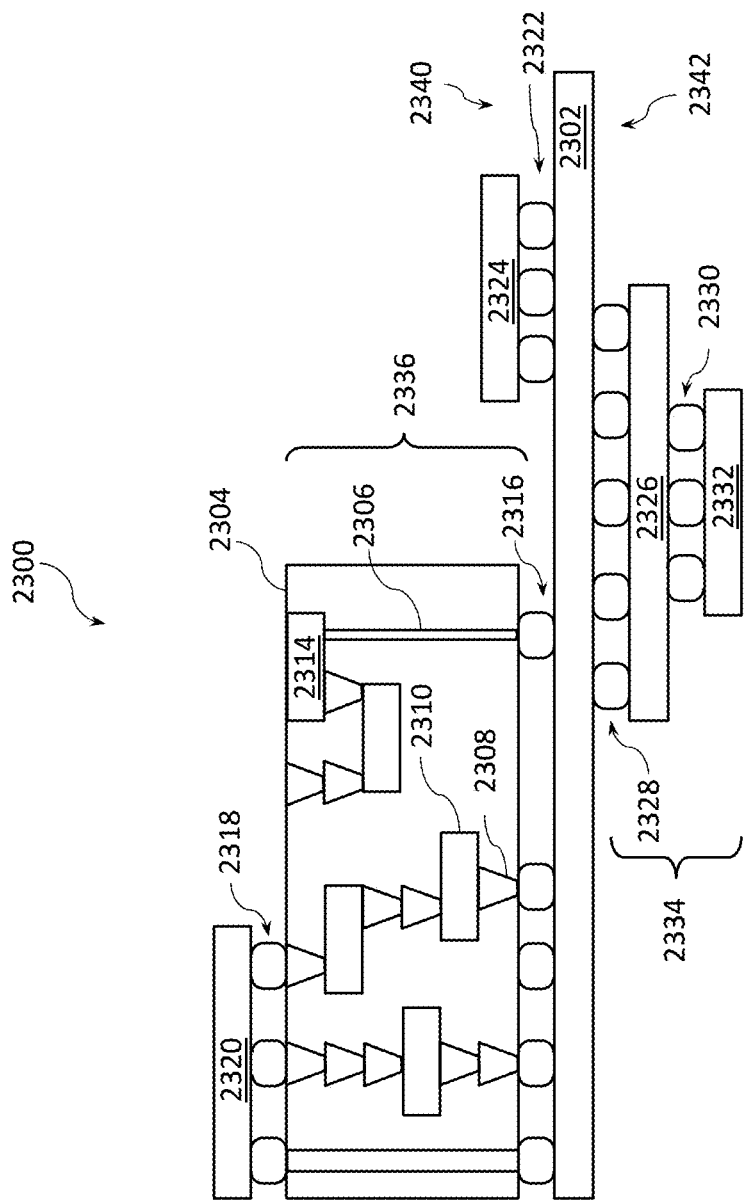
FIG. 5 is a cross-sectional side view of an IC device assembly that may include one or more metallization stacks fabricated using helmets and wrap-around dielectric spacers to realize vertical metal splitting, in accordance with various embodiments.

FIG. 5 is a cross-sectional side view of an IC device assembly 2300 that may include components having one or more metallization stacks fabricated using helmets and wrap-around dielectric spacers to realize vertical metal splitting in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more metallization stacks fabricated using helmets and wrap-around dielectric spacers to realize vertical metal splitting in accordance with any of the embodiments disclosed herein; e.g., any of the IC packages discussed below with reference to the IC device assembly 2300 may take the form of any of the embodiments of the IC package 2200 discussed above with reference to FIG. 4 (e.g., may include one or more metallization stacks fabricated using helmets and wrap-around dielectric spacers to realize vertical metal splitting provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 5 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 5), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 3B), an IC device, or any other suitable component. In particular, the IC package 2320 may include one or more metallization stacks fabricated using helmets and wrap-around dielectric spacers to realize vertical metal splitting as described herein. Although a single IC package 2320 is shown in FIG. 5, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 5, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include any number of metal lines 2310, vias 2308, and through-silicon vias (TSVs) 2306. In some embodiments, at least some of the metal lines 2310 of the adjacent metallization layers may be staggered using vertical metal splitting by means of helmets and wrap-around dielectric spacers as described herein. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as RF devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 5 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 6:
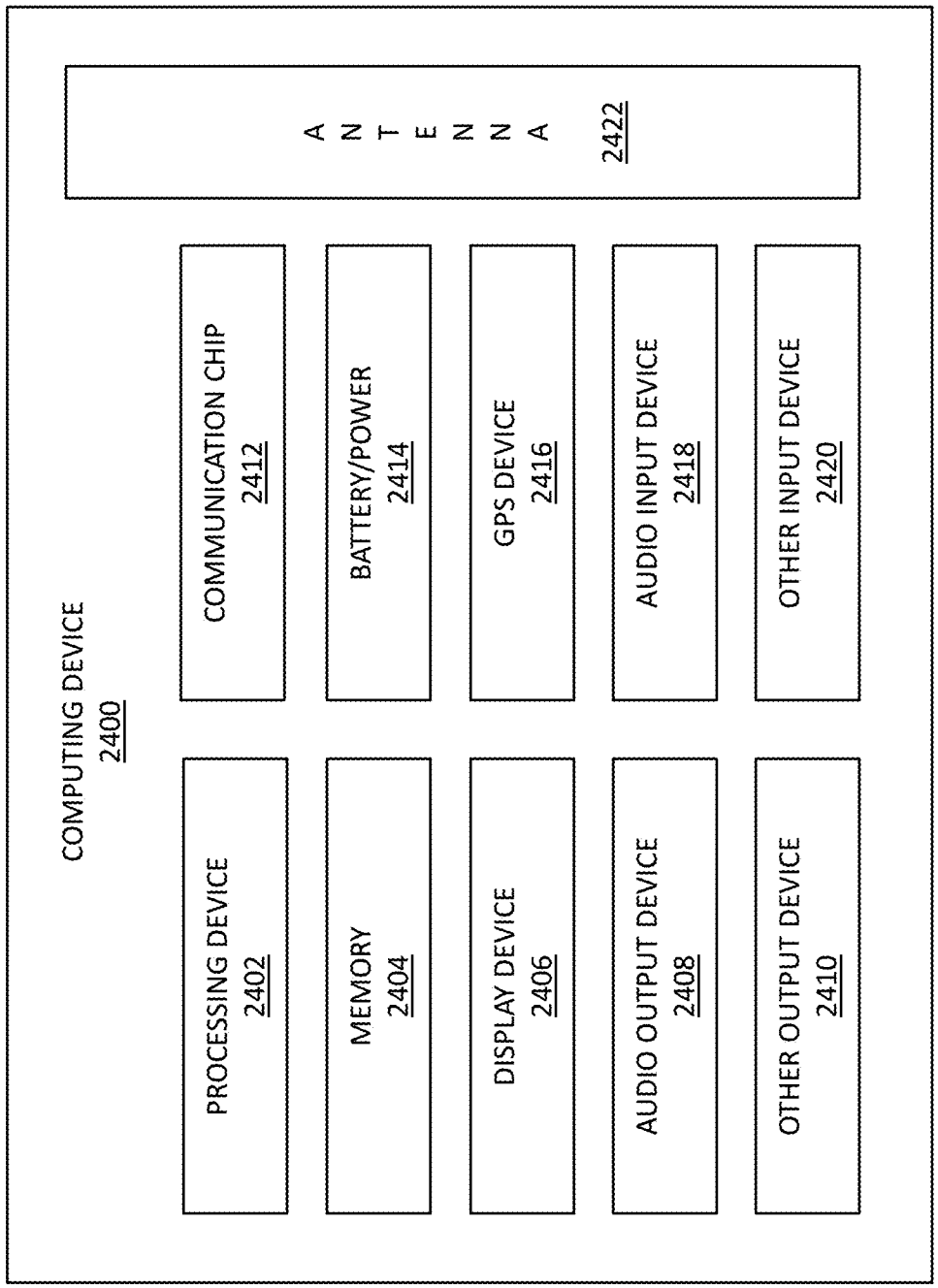
FIG. 6 is a block diagram of an example computing device that may include one or more metallization stacks fabricated using helmets and wrap-around dielectric spacers to realize vertical metal splitting, in accordance with various embodiments.

FIG. 6 is a block diagram of an example computing device 2400 that may include one or more components with one or more metallization stacks fabricated using helmets and wrap-around dielectric spacers to realize vertical metal splitting in accordance with any of the embodiments disclosed herein. For example, any suitable ones of the components of the computing device 2400 may include a die (e.g., the die 2002, shown in FIG. 3B) including one or more metallization stacks fabricated using helmets and wrap-around dielectric spacers to realize vertical metal splitting in accordance with any of the embodiments disclosed herein. Any of the components of the computing device 2400 may include an IC package 2200 (e.g., as shown in FIG. 4). Any of the components of the computing device 2400 may include an IC device assembly 2300 (e.g., as shown in FIG. 5).

A number of components are illustrated in FIG. 6 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 6, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides am IC structure that includes a support structure (e.g., a support structure 242, shown in the present drawings, e.g., a substrate); a first metallization layer, including a first electrically conductive line (e.g., a metal line 254, shown in FIG. 2K), where sidewalls of the first electrically conductive line are enclosed by a first dielectric spacer material (e.g., a wrap-around dielectric spacer 258, shown in FIG. 2K) and a first ILD material (e.g., an ILD material 262, shown in FIG. 2K), so that, for each of the sidewalls of the first electrically conductive line, the first dielectric spacer material is between the first ILD material and an electrically conductive material of the first electrically conductive line; and a second metallization layer, including a second electrically conductive line (e.g., a metal lines 266, shown in the present drawings), where sidewalls of the second electrically conductive line are enclosed by a second dielectric spacer material (e.g., a wrap-around dielectric spacer 278, shown in FIG. 2K, which may be either the same or different from the first dielectric spacer material) and a second ILD material (e.g., an ILD material 282, shown in FIG. 2K, which may be either the same or different from the first ILD material), so that, for each of the sidewalls of the second electrically conductive line, the second dielectric spacer material is between the second ILD material and an electrically conductive material of the second electrically conductive line. In such an IC structure, the first metallization layer is between the support structure and the second metallization layer (i.e., the second metallization layer is stacked above the first metallization layer), and projections of the first electrically conductive line and of the second electrically conductive line onto the support structure are substantially parallel.

Example 2 provides the IC structure according to example 1, where the second dielectric spacer material is etch-selective with respect to the first ILD material, so that the second dielectric spacer material may be etched without substantially etching the first ILD material (e.g., in the process 120 of the method 100).

Example 3 provides the IC structure according to examples 1 or 2, where the first dielectric spacer material is etch-selective with respect to the first ILD material, so that the first dielectric spacer material may be etched without substantially etching the first ILD material (e.g., in the process 120 of the method 100).

Example 4 provides the IC structure according to any one of the preceding examples, where the first dielectric spacer material is not etch-selective with respect to the second dielectric spacer material.

Example 5 provides the IC structure according to any one of the preceding examples, where the second dielectric spacer material along one of the sidewalls of the second electrically conductive line is in contact with the first dielectric spacer material along one of the sidewalls of the first electrically conductive line.

Example 6 provides the IC structure according to any one of the preceding examples, where the first electrically conductive line and the second electrically conductive line are staggered.

Example 7 provides the IC structure according to any one of the preceding examples, further including a helmet material (e.g., portions 268 of the helmet 260, shown in FIG. 2H) that extends along at least one upper edge (e.g., along both upper edges) of the first electrically conductive line.

Example 8 provides the IC structure according to example 7, where the first dielectric spacer material is etch-selective with respect to the helmet material, so that the first dielectric spacer material may be etched without substantially etching the helmet material (e.g., in the process 110 of the method 100).

Example 9 provides the IC structure according to examples 7 or 8, where the helmet material is etch-selective with respect to the first ILD material, so that the helmet material may be etched without substantially etching the first ILD material (e.g., in the process 116 of the method 100).

Example 10 provides the IC structure according to any one of examples 7-9, where the helmet material is a first helmet material, the IC structure further includes a second helmet material (e.g., the helmet 280, shown in FIG. 2K) that extends along at least one upper edge (e.g., along both upper edges, and possibly over the top) of the second electrically conductive line, and the second dielectric spacer material is etch-selective with respect to the second helmet material, so that the second dielectric spacer material may be etched without substantially etching the second helmet material (e.g., in the process 120 of the method 100).

Example 11 provides an IC structure that includes a support structure (e.g., a substrate); a first metallization layer, including a first electrically conductive line (e.g., a metal line 254, shown in FIG. 2K); and a second metallization layer, including a second electrically conductive line (e.g., a metal lines 266, shown in the present drawings). In such an IC structure, the first metallization layer is between the support structure and the second metallization layer (i.e., the second metallization layer is stacked above the first metallization layer), the first electrically conductive line and the second electrically conductive line are staggered, sidewalls of the first electrically conductive line are conformally lined with a first dielectric spacer material (e.g., a wrap-around dielectric spacer 258, shown in FIG. 2K), a first helmet material (e.g., portions 268 of the helmet 260, shown in FIG. 2H) extends along at least one upper edge (e.g., along both upper edges) of the first electrically conductive line, and the first dielectric spacer material is etch-selective with respect to the first helmet material.

Example 12 provides the IC structure according to example 11, where sidewalls of the second electrically conductive line are enclosed by a second dielectric spacer material (e.g., a wrap-around dielectric spacer 278, shown in FIG. 2K, which may be either the same or different from the first dielectric spacer material).

Example 13 provides the IC structure according to example 12, where the second electrically conductive line is electrically isolated from the first electrically conductive line by one or more of the first dielectric spacer material, the second dielectric spacer material, and the first helmet material.

Example 14 provides the IC structure according to examples 12 or 13, where a second helmet material (e.g., the helmet 280, shown in FIG. 2K) extends along at least one upper edge (e.g., along both upper edges and possible over the top) of the second electrically conductive line.

Example 15 provides the IC structure according to example 14, where the second dielectric spacer material is etch-selective with respect to the second helmet material.

Example 16 provides the IC structure according to examples 14 or 15, where the first dielectric spacer material is etch-selective with respect to the second helmet material.

Example 17 provides a method of providing an IC structure. The method includes providing a support structure (e.g., a substrate); providing a first metallization layer that includes a first electrically conductive line (e.g., a metal line 254, shown in FIG. 2K), where sidewalls of the first electrically conductive line are enclosed by a first dielectric spacer material (e.g., a wrap-around dielectric spacer 258, shown in FIG. 2K) and a first ILD material (e.g., an ILD material 262, shown in FIG. 2K), so that, for each of the sidewalls of the first electrically conductive line, the first dielectric spacer material is between the first ILD material and an electrically conductive material of the first electrically conductive line; and providing a second metallization layer that includes a second electrically conductive line (e.g., a metal lines 266, shown in the present drawings), where sidewalls of the second electrically conductive line are enclosed by a second dielectric spacer material (e.g., a wrap-around dielectric spacer 278, shown in FIG. 2K, which may be either the same or different from the first dielectric spacer material) and a second ILD material (e.g., an ILD material 282, shown in FIG. 2K, which may be either the same or different from the first ILD material), so that, for each of the sidewalls of the second electrically conductive line, the second dielectric spacer material is between the second ILD material and an electrically conductive material of the second electrically conductive line. In such a method, the first metallization layer is between the support structure and the second metallization layer (i.e., the second metallization layer is stacked above the first metallization layer), and projections of the first electrically conductive line and of the second electrically conductive line onto the support structure are substantially parallel.

Example 18 provides the method according to example 17, where the second dielectric spacer material is etch-selective with respect to the first ILD material and the method includes etching the second dielectric spacer material without substantially etching the first ILD material (e.g., in the process 120 of the method 100).

Example 19 provides the method according to examples 17 or 18, where the first dielectric spacer material is etch-selective with respect to the first ILD material and the method includes etching the first dielectric spacer material without substantially etching the first ILD material (e.g., in the process 120 of the method 100).

Example 20 provides the method according to any one of examples 17-19, where the method further includes providing a helmet material (e.g., portions 268 of the helmet 260, shown in FIG. 2H) that extends along at least one upper edge (e.g., along both upper edges) of the first electrically conductive line, the first dielectric spacer material is etch-selective with respect to the helmet material, and the method further includes etching the first dielectric spacer material without substantially etching the helmet material (e.g., in the process 110 of the method 100).

Example 21 provides the method according to example 20, where the helmet material is etch-selective with respect to the first ILD material and the method further includes etching the helmet material without substantially etching the first ILD material (e.g., in the process 116 of the method 100).

Example 22 provides the method according to examples 20 or 21, where the helmet material is a first helmet material, the method further includes providing a second helmet material (e.g., the helmet 280, shown in FIG. 2K) that extends along at least one upper edge (e.g., along both upper edges, and possibly over the top) of the second electrically conductive line, the second dielectric spacer material is etch-selective with respect to the second helmet material, and the method further includes etching the second dielectric spacer material without substantially etching the second helmet material (e.g., in the process 120 of the method 100).

Example 23 provides an IC package that includes an IC die that includes an IC structure according to any one of the preceding examples (e.g., the IC structure according to any one of examples 1-16 and/or an IC structure formed according to the method according to any one of examples 17-22) and a further IC component, coupled to the IC die.

Example 24 provides the IC package according to example 23, where the further component is one of a package substrate, a flexible substrate, or an interposer.

Example 25 provides the IC package according to examples 23 or 24, where the further component is coupled to the IC die via one or more first-level interconnects.

Example 26 provides the IC package according to example 25, where the one or more first-level interconnects include one or more solder bumps, solder posts, or bond wires.

Example 27 provides a computing device that includes a circuit board; and an IC die coupled to the circuit board, where the IC die includes one or more of: 1) one or more of the IC structures according to any one of examples 1-16, 2) one or more of the IC structures formed according to the method according to any one of examples 17-22, and 3) one or more of IC packages according to any one of the preceding examples (e.g., each IC package may be an IC package according to any one of examples 23-26).

Example 28 provides the computing device according to example 27, where the computing device is a wearable computing device (e.g., a smart watch) or handheld computing device (e.g., a mobile phone).

Example 29 provides the computing device according to examples 27 or 28, where the computing device is a server processor.

Example 30 provides the computing device according to examples 27 or 28, where the computing device is a motherboard.

Example 31 provides the computing device according to any one of examples 27-30, where the computing device further includes one or more communication chips and an antenna.

Example 32 provides a method of fabricating an IC structure, the method comprising processes for forming the IC structure according to any one of the preceding examples (e.g., the IC structure may be an IC structure according to any one of examples 1-16).

Example 33 provides a method of fabricating an IC package, the method comprising processes for forming the IC package according to any one of the preceding examples (e.g., the IC package may be an IC package according to any one of examples 23-26).

Example 34 provides a method of fabricating an computing device, the method comprising processes for forming the computing device according to any one of the preceding examples (e.g., the computing device may be a computing device according to any one of examples 27-31).

Example 35 provides a method of fabricating an microelectronic device that may include one or more of the IC structures according to any one of the preceding examples, the method comprising processes for forming the one or more of the IC structures according to any one of the preceding examples (e.g., each of the one or more of the IC structures may be IC structures according to any one of examples 1-16).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising:
    a substrate;
    a first metallization layer, comprising a first electrically conductive line, wherein sidewalls of the first electrically conductive line are enclosed by a first dielectric spacer material and a first interlayer dielectric (ILD) material, and wherein, for an individual one of the sidewalls of the first electrically conductive line, the first dielectric spacer material is between the first ILD material and an electrically conductive material of the first electrically conductive line; and
    a second metallization layer, comprising a second electrically conductive line, wherein sidewalls of the second electrically conductive line are enclosed by a second dielectric spacer material and a second ILD material, and wherein, for an individual one of the sidewalls of the second electrically conductive line, the second dielectric spacer material is between the second ILD material and an electrically conductive material of the second electrically conductive line,
    wherein:
        the first metallization layer is between the substrate and the second metallization layer,
        the second electrically conductive line is staggered with respect to the first electrically conductive line, and
        the second dielectric spacer material along one of the sidewalls of the second electrically conductive line is in contact with the first dielectric spacer material along one of the sidewalls of the first electrically conductive line.

2. The IC structure according to claim 1, wherein the second dielectric spacer material is etch-selective with respect to the first ILD material.

3. The IC structure according to claim 1, wherein the first dielectric spacer material is etch-selective with respect to the first ILD material.

4. The IC structure according to claim 1, wherein the first dielectric spacer material is not etch-selective with respect to the second dielectric spacer material.

5. The IC structure according to claim 1, wherein the first electrically conductive line and the second electrically conductive line are staggered.

6. The IC structure according to claim 1, further comprising a helmet material that extends along at least one upper edge of the first electrically conductive line.

7. The IC structure according to claim 6, wherein the first dielectric spacer material is etch-selective with respect to the helmet material.

8. The IC structure according to claim 6, wherein the helmet material is etch-selective with respect to the first ILD material.

9. The IC structure according to claim 6, wherein:
    the helmet material is a first helmet material,
    the IC structure further comprises a second helmet material that extends along at least one upper edge of the second electrically conductive line, and
    the second dielectric spacer material is etch-selective with respect to the second helmet material.

10. The IC structure according to claim 1, wherein the electrically conductive material of the first electrically conductive line and the electrically conductive material of the second electrically conductive line are separated by the second dielectric spacer material along one of the sidewalls of the second electrically conductive line and the first dielectric spacer material along one of the sidewalls of the first electrically conductive line.

11. A method of providing an integrated circuit (IC) structure, the method comprising:
providing a support structure;
providing a first metallization layer that includes a first electrically conductive line, wherein sidewalls of the first electrically conductive line are enclosed by a first dielectric spacer material and a first interlayer dielectric (ILD) material, and wherein, for an individual one of the sidewalls of the first electrically conductive line, the first dielectric spacer material is between the first ILD material and an electrically conductive material of the first electrically conductive line; and
providing a second metallization layer that includes a second electrically conductive line, wherein sidewalls of the second electrically conductive line are enclosed by a second dielectric spacer material and a second ILD material, and wherein, for an individual one of the sidewalls of the second electrically conductive line, the second dielectric spacer material is between the second ILD material and an electrically conductive material of the second electrically conductive line,
wherein:
the first metallization layer is between the support structure and the second metallization layer,
the second electrically conductive line is staggered with respect to the first electrically conductive line, and
the second dielectric spacer material along one of the sidewalls of the second electrically conductive line is in contact with the first dielectric spacer material along one of the sidewalls of the first electrically conductive line.

12. The method according to claim 11, wherein the second dielectric spacer material is etch-selective with respect to the first ILD material and the method includes etching the second dielectric spacer material without substantially etching the first ILD material.

13. The method according to claim 11, wherein the first dielectric spacer material is etch-selective with respect to the first ILD material and the method includes etching the first dielectric spacer material without substantially etching the first ILD material.

14. The method according to claim 11, wherein:
the method further includes providing a helmet material that extends along at least one upper edge of the first electrically conductive line,
the first dielectric spacer material is etch-selective with respect to the helmet material, and
the method further includes etching the first dielectric spacer material without substantially etching the helmet material.

15. An integrated circuit (IC) package, comprising:
a substrate;
a first metallization layer, comprising a first electrically conductive line, wherein sidewalls of the first electrically conductive line are enclosed by a first dielectric spacer material and a first interlayer dielectric (ILD) material, and wherein, for an individual one of the sidewalls of the first electrically conductive line, the first dielectric spacer material is between the first ILD material and an electrically conductive material of the first electrically conductive line; and
a second metallization layer, comprising a second electrically conductive line, wherein sidewalls of the second electrically conductive line are enclosed by a second dielectric spacer material and a second ILD material, and wherein, for an individual one of the sidewalls of the second electrically conductive line, the second dielectric spacer material is between the second ILD material and an electrically conductive material of the second electrically conductive line,
wherein:
the first metallization layer is between the substrate and the second metallization layer,
a longitudinal axis of the first electrically conductive line and a longitudinal axis of the second electrically conductive line are substantially parallel,
the IC package includes a materially continuous dielectric spacer that includes the second dielectric spacer material along one of the sidewalls of the second electrically conductive line and the first dielectric spacer material along one of the sidewalls of the first electrically conductive line, and
the materially continuous dielectric spacer separates the electrically conductive material of the first electrically conductive line and the electrically conductive material of the second electrically conductive line.

16. The IC package according to claim 15, wherein the second electrically conductive line is staggered with respect to the first electrically conductive line.

17. The IC package according to claim 15, further comprising:
an IC die; and
a further component coupled with the IC die,
wherein the IC die includes the substrate, the first metallization layer, the second metallization layer, and the materially continuous dielectric spacer.

18. The IC package according to claim 17, wherein the further component is one of a package substrate, a flexible substrate, or an interposer.

19. The IC package according to claim 17, wherein the further component is coupled with the IC die via one or more first-level interconnects.

* * * * *

UNITED STATES PATENT AND TRADEMARK OFFICE
CERTIFICATE OF CORRECTION

| | | |
|---|---|---|
| PATENT NO. | : 12,131,989 B2 | Page 1 of 1 |
| APPLICATION NO. | : 17/099823 | |
| DATED | : October 29, 2024 | |
| INVENTOR(S) | : Leonard P. Guler et al. | |

It is certified that error appears in the above-identified patent and that said Letters Patent is hereby corrected as shown below:

On the Title Page

In Item (57), under "ABSTRACT", in Column 2, Line 11, delete "there" and insert -- they --, therefor.

Signed and Sealed this
Third Day of December, 2024

*Katherine Kelly Vidal*

Katherine Kelly Vidal
*Director of the United States Patent and Trademark Office*